(12) United States Patent
Raychaudhuri et al.

(10) Patent No.: US 12,155,923 B2
(45) Date of Patent: Nov. 26, 2024

(54) COMMUNICATIONS CHANNEL WITH MULTI-LEVEL SIGNAL TRANSMISSION

(71) Applicant: SEMICONDUCTOR COMPONENTS INDUSTRIES, LLC, Phoenix, AZ (US)

(72) Inventors: Arindam Raychaudhuri, Bangalore (IN); Jhankar Malakar, Kolkata (IN); Sisir Maity, Egra (IN); Sushma Nirmala Sambatur, Bangalore (IN)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 472 days.

(21) Appl. No.: 17/455,306

(22) Filed: Nov. 17, 2021

(65) Prior Publication Data

US 2023/0011466 A1 Jan. 12, 2023

(30) Foreign Application Priority Data

Jul. 9, 2021 (IN) .............................. 202111030830

(51) Int. Cl.
*H04N 5/232* (2006.01)
*H03M 9/00* (2006.01)
*H04M 1/04* (2006.01)
*H04N 23/60* (2023.01)

(52) U.S. Cl.
CPC .............. *H04N 23/60* (2023.01); *H03M 9/00* (2013.01); *H04M 1/04* (2013.01)

(58) Field of Classification Search
CPC .. H04N 23/665; H04N 23/60; H03K 19/0175; H03M 9/00; H04M 1/04; H04L 25/4917; H04L 25/03343
See application file for complete search history.

(56) References Cited

U.S. PATENT DOCUMENTS

| | | | |
|---|---|---|---|
| 7,030,657 B2 | 4/2006 | Stojanovic et al. | |
| 7,308,058 B2 | 12/2007 | Zerbe et al. | |
| 9,065,446 B1* | 6/2015 | Savithri | G06F 30/34 |
| 9,148,198 B1* | 9/2015 | Zhang | H04B 3/04 |
| 12,003,233 B1* | 6/2024 | Tripathi | H03K 19/20 |
| 2009/0290626 A1 | 11/2009 | Thurston et al. | |
| 2013/0308027 A1* | 11/2013 | Jenkin | H04N 25/46 348/302 |
| 2015/0146766 A1 | 5/2015 | Longo et al. | |

(Continued)

*Primary Examiner* — Aristocratis Fotakis
(74) *Attorney, Agent, or Firm* — Treyz Law Group, P.C.; Tianyi He

(57) ABSTRACT

A system may include multiple electrical components. One electrical component such as an imaging sub-system may be communicatively coupled to another electrical component such as control circuitry for the system. The imaging-subsystem may include transmitter circuitry. The transmitter circuitry can include driver circuitry configured to provide the transmitter circuitry output using a multi-level signaling scheme. To generate the control signals for the driver circuitry, pre-driver combinational logic may precede the serializer circuitry and be coupled to the word data latch circuitry. In such a manner, the generated control signals for different portions of the driver circuitry can be better synchronized with one another, thereby helping improve data EYE margin in the multi-level signal scheme.

20 Claims, 4 Drawing Sheets

(56) References Cited

U.S. PATENT DOCUMENTS

| | | | |
|---|---|---|---|
| 2015/0381232 A1* | 12/2015 | Ulrich | G11C 29/028 |
| | | | 375/230 |
| 2018/0054605 A1* | 2/2018 | Grubner | H04N 19/00 |
| 2018/0131503 A1 | 5/2018 | Duan et al. | |
| 2019/0109755 A1 | 4/2019 | Hollis et al. | |
| 2019/0179791 A1* | 6/2019 | Shokrollahi | G11C 7/1087 |
| 2019/0215146 A1* | 7/2019 | Ke | H04L 7/042 |
| 2019/0272804 A1* | 9/2019 | Amirkhany | H03K 21/38 |
| 2021/0367749 A1* | 11/2021 | Lee | H04L 25/028 |

* cited by examiner

COMMUNICATIONS CHANNEL WITH MULTI-LEVEL SIGNAL TRANSMISSION

BACKGROUND

This relates generally to electronic systems, and more particularly, to data transmitting circuitry in electronic systems.

An electronic system can include multiple components that are communicatively coupled to each other via corresponding communications channels In some applications, Serializer-Deserializer-based (SerDes-based) communications circuitry may be used to convey signals across these communications channels. These applications typically also require relatively high data transfer rates such as data rates greater than Gbs/sec. To provide these high data transfer, the communications circuitry may employ rate multi-(voltage)-level signal transmission (e.g., multi-symbol transmission) schemes to transmit signals (symbols) across these communications channels.

However, utilizing these multi-level signal transmission schemes requires precisely timed control signals for the driver circuitry in the transmitter to provide a satisfactory data EYE margin (e.g., data EYE height, data EYE width, etc.) and/or meet other performance metrics. It can be difficult to meet the precise timings for the driver circuitry control signals and consequently provide satisfactory performance.

It is within this context that the embodiments herein arise.

DETAILED DESCRIPTION

Electronic systems typically include multiple components that are communicatively coupled to one another via corresponding communications channels.

Figure 1:
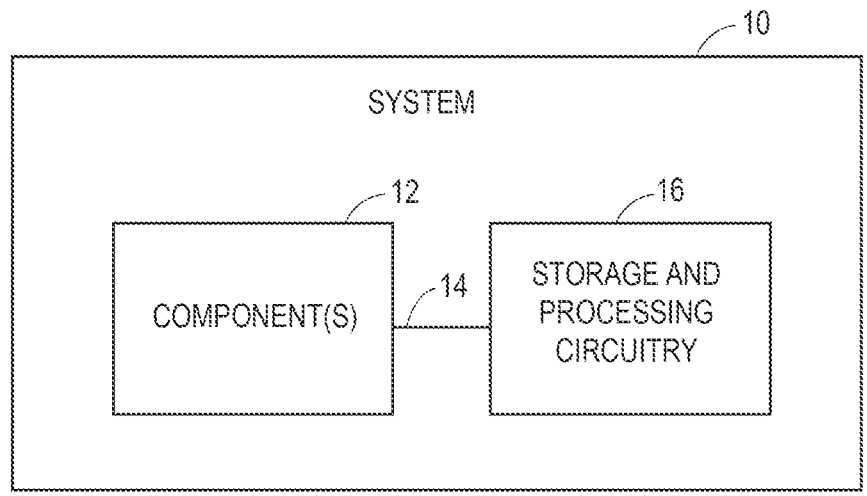
FIG. 1 is a functional block diagram of an illustrative system having one or more components coupled to control circuitry in accordance with some embodiments.

FIG. 1 shows a functional block diagram of an illustrative electronic system such as system 10. System 10 may be a portable electronic device such as a camera, a cellular telephone, a tablet computer, a webcam, a video camera, a video surveillance system, or any other portable electronic device, may be an automotive system such as an automotive electronic system, an automotive sensor (sensing) system, an automotive imaging system, an embedded system in automotive electronics, or any other part of an automotive system, may be any other system with imaging capabilities such as a video gaming system with imaging capabilities, or may be any other desired electronic system with or without imaging systems.

Systems 10 can include one or more components 12 coupled to storage and processing circuitry 16 (sometimes referred to herein collectively as control circuitry 16). Storage and processing circuitry 16 may be implemented using and include one or more integrated circuits. As illustrative examples, the processing component of circuitry 16 may include one or more processors each with one or more processing cores, one or more microprocessors or microcontrollers, or any other suitable circuitry for manipulating or processing data. The storage component of circuitry 16 may include non-volatile memory circuitry such as a hard drive, a solid-state drive, read-only memory, or any other type of non-volatile memory circuitry. If desired, circuitry 16 may include volatile memory such as random-access memory.

In some illustrative configurations described herein as examples, the storage component of circuitry 16 (e.g., non-transitory computer-readable media) stores instructions (e.g., software, firmware, code, etc.) executable by the processing component of circuitry 16. When executed by the processing component of circuitry 16, these instructions can implement one or more processes (e.g., processing schemes, control schemes, etc.) described herein. In such a manner, control circuitry 16 can control the operations of system 10.

During the operation of system 10, control circuitry 16 may communicate with one or more components 12. Components 12 may include input circuitry configured to receive user input, output circuitry configured to provide a user with system output (e.g., a visual output for the user, a tactile output user, etc.), sensor circuitry configured to gather sensor data indicative of conditions of an environment in which system 10 lies and/or indictive of other conditions (e.g., a user condition, a component condition within system 10, etc.), wireless or wired communications circuitry, additional control circuitry, or any other suitable electrical component within system 10. System 10 may include any suitable number of these components and/or other components.

One or more communications paths such as communications channels 14 may be used transmit and/or receive data between component 12 and control circuitry 16. Illustrative configurations in which communications channel 14 is implemented using one or more physical (electrical) paths (e.g., wires, buses, etc.) are described herein as examples.

While communications channel 14 is shown in FIG. 1 to couple component 12 to control circuitry 16, this is merely illustrative. If desired, a communications path (e.g., having one or more communications channels) may couple one component 12 to another component 12, may couple control circuitry 12 to additional control circuitry on component 12, may communicatively couple any two elements within system 10, may communicatively couple an element in system 10 to an element external to system 10, etc.

Figure 2:
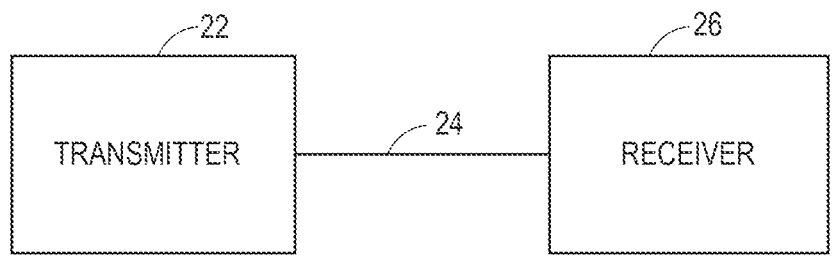
FIG. 2 is a functional block diagram of an illustrative communications channel between a transmitter and a receiver in accordance with some embodiments.

FIG. 2 shows a functional block diagram of an illustrative wired communications system with a transmitter such as transmitter 22 (sometimes referred to herein as transmitter circuitry 22) and a receiver such as receiver 26 (sometimes referred to herein as receiver circuitry 26). As shown in FIG. 2, transmitter 22 can transmit data over a communications path such as one or more communications channels 24 to receiver 26. Communications channels 24 may be formed from electrical paths between transmitter 22 and receiver 26.

As examples, communications channel 24 may include conductive printed circuit traces, conductive printed circuit vias, connectors, interface circuitry, etc.).

As an illustrative example, transmitter 22 may be implemented at component 12 (e.g., as a part of or integrated onto component 12, or as a discrete component that serves as an interface between component 12 the communications path). Receiver 26 may be implemented at control circuitry 16 (e.g., as a part of or integrated onto control circuitry 16, or as a discrete component that serves as an interface between the communications path and control circuitry 16).

If desired, transmitter circuitry 22 may form a portion of transceiver circuitry (e.g., at component 12), while the transceiver circuitry also includes corresponding receiver circuitry (e.g., at component 12). Similarly, if desired, receiver circuitry 26 may form a portion of transceiver circuitry (e.g., at control circuitry 16), while the receiver circuitry also includes corresponding receiver circuitry (e.g., at control circuitry 16).

In general, transmitter circuitry 22 and receiver circuitry 26 may be implemented in any suitable manner. Configurations in which transmitter circuitry 22 includes serializer circuitry and receiver circuitry 26 includes deserializer circuitry are described herein as illustrative examples. In other words, communications circuitry 22 and 26 may be SerDes-based communications circuitry. In some configurations, transmitter circuitry 22 may be implemented without feed-forward equalization (e.g., without a feed-forward equalizer). If desired, transmitter circuitry may include a feed-forward equalizer.

Transmitter circuitry 22 (and consequently receiver circuitry 26) can be configured to use any suitable protocol or scheme to perform the data transfer operations (e.g., can use any signaling scheme). However, with an ever-increasing number of components in complex systems, each component serving multi-purpose applications, the amount of data to be transferred between components (e.g., between sensor circuitry and control circuitry) is growing quickly.

To better satisfy the growing need for the high-speed data transfer operations, transmitter circuitry 22 may be configured to employ a multi-(voltage)-level signaling scheme such as the PAM (Pulse Amplitude Modulation) 4-level scheme, the PAM 8-level scheme, a multi-level signaling scheme compatible with MIPI C-PHY, etc. In multi-level signaling schemes, transmitter circuitry 22 may convey symbols using multiple (e.g., greater than two) voltage levels (e.g., each different symbol being defined by a number of different voltage levels). In such a manner, transmitter circuitry 22 can convey a greater amount of data over the same time (compared to a binary signaling scheme such as the NRZ (non-return-to-zero) scheme or PAM 2-level scheme).

However, with by using multi-level signaling schemes, data EYE margin of the transmitted signal (symbol) may suffer (e.g., shorter data EYE height and/or shorted data EYE width), thereby making the data transmission more susceptible to data EYE corruption (compared to a binary signaling scheme). These (data EYE margin) issues are further exacerbated by timing mismatches when controlling the driver circuitry directly responsible to perform the signaling (e.g., generating the different voltage levels or symbols).

Figure 3:
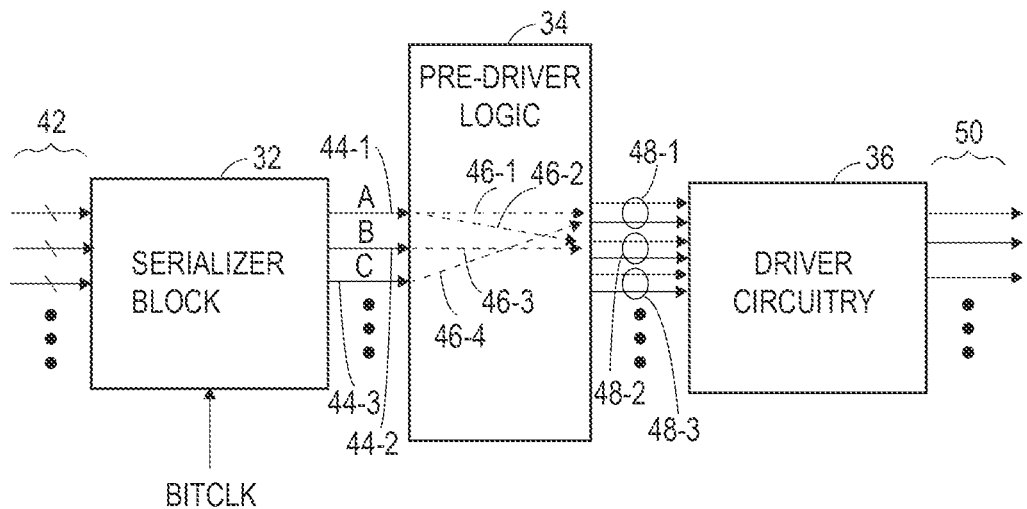
FIG. 3 is a functional block diagram of serializer-based transmitter circuitry exhibiting path delay mismatch at pre-driver logic.

In particular, FIG. 3 shows a functional block diagram of serializer-based transmitter circuitry exhibiting path delay mismatches at pre-driver logic (e.g., pre-driver logic 34). As shown in FIG. 3, the transmitter circuitry includes serializer block 32 that receives word data along paths 42 to be serialized by serializer block 32. Serializer block 32 receives and operates using bit rate clock BITCLK. Serializer can convert each set of received parallel data bits (each set forming a portion of a word) at its input into a serial set of data bits at its output. In such a manner, serializer block 32 can output a word at its output along paths 44-1, 44-2, 44-3, etc. At a given time, the serializer outputs, collectively, may represent a word for transmission. In other words, bit A, bit B, and bit C can represent a 3-bit word for transmission (if serializer block 32 only includes these three outputs).

Pre-driver logic 34 can use bits A, B, C, etc., to generate the driver control signals (e.g., along paths 48-1, 48-2, 48-3, etc.) that cause driver circuitry 36 to exhibit the corresponding symbol (representing the word associated with bits A, B, C, etc.) for transmission along communications channel 50.

However, issues can arise at pre-driver logic 34 that can cause degradation to the transmitted data EYE margin. In the illustrative example of FIG. 3, pre-driver logic 34 uses a first set of bits from paths 44 (e.g., bit A from path 44-1 and bit C from path 44-3) to generate one or more control signals on path 48-1 for a first driver circuit in driver circuitry 36 (e.g., used to generate one of the signal paths in communications channel 50). Pre-driver logic 34 uses a second set of bits from paths 44 (e.g., bit A from path 44-1 and bit B from path 44-2) to generate one or more control signals on path 48-2 for a second driver circuit in driver circuitry 36 (e.g., used to generate another one of the signal paths in communications channel 50).

As shown in FIG. 3, path 46-1 may route bit A (e.g., through intervening logic circuitry such as one or more logic gates that perform logic operations based on bit A) to generate output at paths 48-1, path 46-4 may route bit C (e.g., through intervening logic circuitry such as one or more logic gates that perform logic operations based on bit C) to generate output at paths 48-1. In other words, control signals along paths 48-1 may be generated as a function of bit A and bit C.

Path 46-2 may route bit A (e.g., through intervening logic circuitry such as one or more logic gates that perform logic operations based on bit A) to generate output at paths 48-2, path 46-3 may route bit B (e.g., through intervening logic circuitry such as one or more logic gates that perform logic operations based on bit B) to generate output at paths 48-2. In other words, control signals along paths 48-2 may be generated as a function of bit A and bit B.

Paths 46-1, 46-2, 46-3, and 46-4 are merely illustrative. For the sake of clarity, the intervening logic circuitry performing logic functions on bit A and bit C, and the intervening logic circuitry performing logic functions on bit B and bit C have been omitted. If desired, any suitable logic gates or other logic circuitry may be used to generate the corresponding control signals at each of paths 48-1, 48-2, 48-3, etc. based on bits A, B, C, etc.

In the example of FIG. 3, path lengths along paths 46-2 and 46-3 (e.g., used to generate first control signals on paths 48-2) are different than (e.g., are shorter than) path lengths along paths 46-1 and 46-4 (e.g., used to generate second control signals on path 48-1). In this illustrative example, path 46-4 is the longest path out of the four, requiring routing across paths 46-2 and 46-3. This mismatch in path timing delays cause the timing of different driver control signals (e.g., the timing of control signals along path 48-1 and the timing of control signals along path 48-2) to be offset from each other.

Given that driver control signals along path 48-1 are used to control a driver circuitry portion that generates a first signal path of communications channel 50 and that driver control signals along path 48-2 are used to control a different driver circuitry portion that generate a second signal path of communications channel 50, the timing of different signal paths in communications channel 50 may also be offset. This offset degrades data EYE margin for the data transmitted across communications channel 50. These issues are further exacerbated given that serializer block 32 operates at a relatively high clock rate (e.g., at the bit rate clock, which is higher than a word clock for operating the functional blocks before serializer block 32).

Depending on the (multi-level) signaling schemes employed by the transmitter circuitry, pre-driver logic 34 may use different sets of input bits to generates the output driver control signals. However, in each of these signal schemes, the output control signals along paths 48-1, 48-2, 48-3, etc., will generally be a function of different sets of input bits along paths 44-1, 44-2, 44-3, etc. As such, it is difficult to ensure proper path delay matching across these output driver control signals. Additionally, signal path crossing over other signal paths (e.g., signal path 46-4 crossing over signal paths 46-2 and 46-3) may also cause crosstalk, noise, and other undesired interplay, which can cause data EYE corruption.

Figure 4:
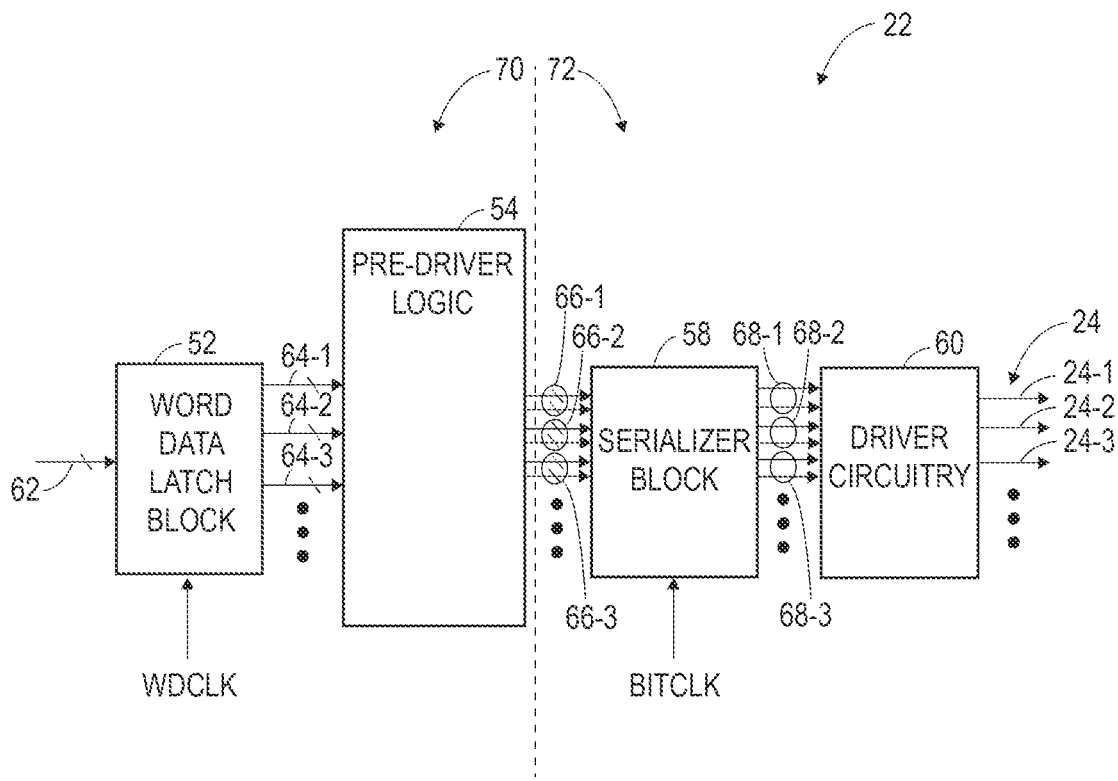
FIG. 4 is a functional block diagram of illustrative transmitter circuitry with pre-driver logic preceding the serializer circuitry in accordance with some embodiments.

To mitigate these issues, transmitter circuitry may modify the configuration of the serializer block and the configuration of pre-driver logic. FIG. 4 shows a functional block diagram of illustrative transmitter circuitry having pre-driver logic preceding a serializer block.

As shown in FIG. 4, transmitter circuitry such as transmitter circuitry 22 (in FIG. 2) includes a word data latch block such as word data latch block 52 (sometimes referred to herein as word data latch circuitry 52, or latch circuitry 52), pre-driver logic such as pre-driver logic 54 (sometimes referred to herein as pre-driver logic circuitry 54, or logic circuitry 54), a serializer block such as serializer block 58 (sometimes referred to herein as serializer circuitry 58) and driver circuitry 60 (sometimes referred to herein as driver block 60).

Word data latch block 52 receives word data over one or more paths 62. As an illustrative example, (word data) lane distribution circuitry, encoder circuitry, mapper circuitry, and/or other word data processing circuitry, may provide the word data over one or more paths 62 to word data latch block 52. Word data latch block 52 may include any suitable number of latches that latch word data from paths 62 to generate corresponding sets of parallel word data portions. These latches may latch based on a word clock WDCLK.

In the example of FIG. 4, word data latch block 52 generates a set of parallel first word data portions over paths 64-1, a set of parallel second word data portions over paths 64-2, a set of parallel third word data portions over paths 64-3, and any other sets of parallel word data portions over other paths coupled to pre-driver logic 54.

Pre-driver logic 54 may receive these parallel word data portions and use the (first, second, third, etc.) different data word portions to generate different sets of corresponding parallel driver control signals over paths 66-1, 66-2, 66-3, etc. As examples, the pre-driver logic output on each path in paths 66-1 may be a function of a first word bit from one of the paths in paths 64-1 and a second word bit from one of the paths in paths 64-3, the pre-driver logic output on each path in paths 66-2 may be a function of a first word bit from one of the paths in paths 64-1 and a second word bit from one of the paths in paths 64-2, and the pre-driver logic output on each path in paths 66-3 may be a function of a first word bit from one of the paths in paths 64-2 and a second word bit from one of the paths in paths 64-3.

Paths 66-1 may represent a plurality of parallel paths that are ready for serialization. Similarly, paths 66-2 and 66-3 may respectively represent corresponding pluralities of parallel paths that are ready for serialization.

Serializer block 58 may receive these driver control signals from pre-driver logic 54 via the different pluralities of parallel paths in each of paths 66-1, 66-2, and 66-3. Serializer block 58 may output serialized driver control signals over paths 68-1, 68-2, and 68-3. Serializer block 58 may operate using a bit clock BITCLK.

As example, paths 68-1 may provide one or more parallel control signals (e.g., a pull-up signal and a pull-down signal) for a first portion of driver circuitry 60, paths 68-2 may provide one or more parallel control signals (e.g., a pull-up signal and a pull-down signal) for a second portion of driver circuitry 60, and paths 68-3 may provide one or more parallel control signals (e.g., a pull-up signal and a pull-down signal) for a third portion of driver circuitry 60.

Based on these received control signals, driver circuitry 60 may drive signal paths 24-1, 24-2, and 24-3 for communications channel 24 to appropriate voltages to convey the corresponding symbols in the multi-level signaling scheme.

The illustrative configuration of transmitter 22 in FIG. 4 enables the use of multi-level signaling schemes while improving data EYE margin for the transmitted data across communications channel 24. In particular, by coupling pre-driver logic 54 between word data latch block 52 and serializer block 58 (e.g., having pre-driver logic 54 precede serializer block 58 instead of be downstream from serializer block 58), pre-driver logic 54 may receive input signals at a lower (operating) frequency (e.g., at the word data frequency of word clock WDCLK) rather than at a higher (operating) frequency (e.g., at the bit rate frequency of bit clock BITCLK as shown in FIG. 3). The bit rate frequency is typically an integer multiple of the word data frequency. The particular integer multiple is dependent on the particular signaling scheme being employed (e.g., dependent on the conversion rate between words and bits).

In the example of FIG. 4, transmitter 22 is depicted to include operating frequency domain 70 associated with circuitry operating at the word data clock frequency and operating frequency domain 72 associated with circuitry operating at the bit rate clock frequency. As shown in FIG. 4, pre-driver logic 54 is disclosed in word data clock domain 70 (instead of a bit rate clock domain as shown in FIG. 3). While pre-driver logic 54 is formed from combinational logic circuitry and may not include any clocked components (e.g., components that operate using clock WDCLK), input signals on paths 64-1, 64-2, 64-3 received at pre-driver logic 54 update at the word data clock frequency, and output signals on paths 66-1, 66-2, and 66-3 are similarly output at the word data clock frequency.

While similar path delay mismatch issues may still exist in pre-driver logic 54, the output signals from pre-driver logic 54 being latched at serializer block 58 with bit rate clock BITCLK helps resolves these mismatch issues. In other words, latching of pre-driver logic output signals at serializer block 58 allows these output signals to be synchronous with respect to bit rate clock BITCLK.

Additionally, because pre-driver logic 54 is in the slower operating frequency domain 70, as long as the path delay is small relative to the rising and falling edges of word data clock WDCLK, there will be no issues with latching the correct signals at serializer block 58.

Each set of latched and serialized pre-driver logic output signals may then be synchronously provided directly to different portions of driver circuitry 60. As such, between serializer block 58 and driver circuitry 60, there is no path crossing (e.g., minimal cross-talk and noise), and there is no path delay mismatches. This helps improve data EYE margin for the transmitted data as each set of output voltage levels on communications channel 24 (e.g., indicative of symbols) are more in sync (when compared to the configuration of FIG. 3).

Figure 5:
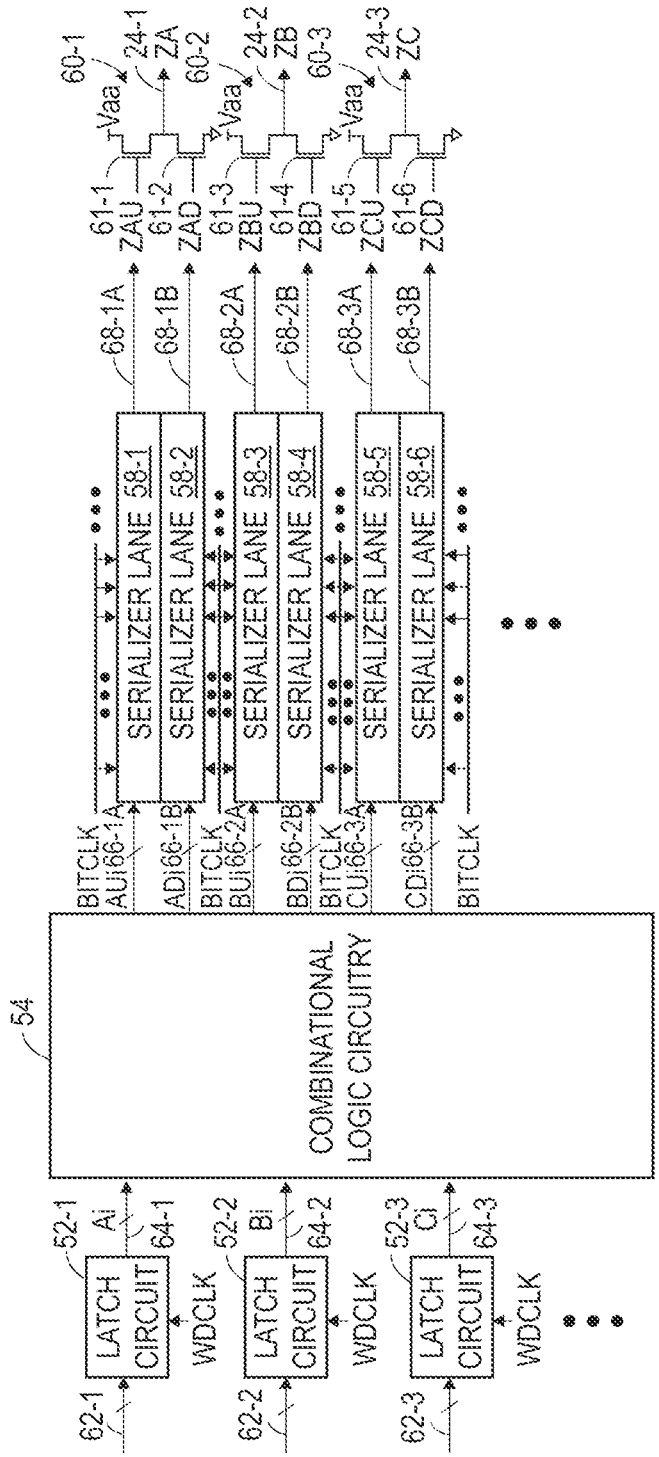
FIG. 5 is a circuit block diagram of illustrative serializer-based transmitter circuitry with combinational logic circuitry between latch circuitry and serializer circuitry in accordance with some embodiments.

FIG. 5 is a circuit block diagram of illustrative transmitter circuitry further detailing portions of the transmitter circuitry of FIG. 4 in an illustrative configuration. In the illustrative configuration of FIG. 5, a word data latch block (e.g., word data latch block 52) can include latch circuit 52-1, latch circuit 52-2, latch circuit 52-3, and any additional latch circuits (e.g., collectively implementing at least a portion of word data latch block 52 in FIG. 4). Each latch circuit may receive a set of parallel word data for latching using the word data clock WDCLK.

As an example, paths 62-1 includes seven parallel paths, paths 62-2 includes seven parallel paths, and paths 62-3 includes seven parallel paths. Each latch circuit may include at least seven corresponding latches each receiving a (word data) signal from a corresponding one of the seven parallel paths.

In this example, paths 64-1 may also include seven parallel paths, paths 64-2 may also include seven parallel paths, paths 64-3 may also include seven parallel paths. Paths 64-1 may carry seven parallel bits Ai (e.g., bits A1, A2, A3, A4, A5, A6, and A7) output from latch circuit 52-1, paths 64-2 may carry seven parallel bits Bi (e.g., bits B1, B2, B3, B4, B5, B6, and B7) output from latch circuit 52-2, and paths 64-3 may carry seven parallel bits Ci (e.g., bits C1, C2, C3, C4, C5, C6, and C7) output from latch circuit 52-3. Each bit in bits Ai along with a corresponding bit in bits Bi and a corresponding bit in bits Ci may collectively represent a 3-bit word. More explicitly, bits A1, B1, and C1 may represent a 3-bit word, bits A2, B2, and C2 may represent another 3-bit word, etc. Accordingly, combinational logic circuitry 54 (e.g., implementing at least a portion of pre-driver logic circuitry 54 in FIG. 4) may generate corresponding driver control (bit) signals AUi, ADi, BUi, BDi, CUi, and CDi (sometimes referred to herein as driver control bits, control bits, or control signals) over paths 66-1A, 66-1B, 66-2A, 66-2B, 66-3A, and 66-3B, respectively. In particular, combinational logic circuitry 54 may perform logic operations on bits A1 and C1 to generate driver control (bit) signals AUi and ADi, may perform logic operations on bits A1 and Bi to generate driver control (bit) signals BUi and BDi, and may perform logic operations on bits Bi and C1 to generate driver control (bit signals CUi and CDi).

Further in this example, given that there are seven sets of bits (e.g., seven Ai bits, seven Bi bits, seven Ci bits), paths 66-1A may include seven paths each carrying a corresponding one of the seven driver control (bit) signals AUi (e.g., a first path carrying driver control (bit) signal AU1 generated based on bits A1 and C1, a second path carrying driver control (bit) signal AU2 generated based on bits A2 and C2, etc.), paths 66-1B may include seven paths each carrying a corresponding one of the seven driver control (bit) signals ADi, paths 66-2A may include seven paths each carrying a corresponding one of the seven driver control (bit) signals BUi, paths 66-2B may include seven paths each carrying a corresponding one of the seven driver control (bit) signals BDi, paths 66-3A may include seven paths each carrying a corresponding one of the seven driver control (bit) signals CUi, paths 66-3B may include seven paths each carrying a corresponding one of the seven driver control (bit) signals CDi.

Serializer lane 58-1 may receive and serialize control bits AUi on the seven paths 66-1A and output the serialized bits as control signal ZAU along path 68-1A. Serializer lane 58-2 may receive and serialize control bits ADi on the seven paths 66-1B and output the serialized bits as control signal ZAD along path 68-1B. Serializer lane 58-3 may receive and serialize control bits BUi on the seven paths 66-2A and output the serialized bits as control signal ZBU along path 68-2A. Serializer lane 58-4 may receive and serialize control bits BDi on the seven paths 66-2B and output the serialized bits as control signal ZBD along path 68-2B. Serializer lane 58-5 may receive and serialize control bits CUi on the seven paths 66-3A and output the serialized bits as control signal ZCU along path 68-3A. Serializer lane 58-6 may receive and serialize control bits CDi on the seven paths 66-3B and output the serialized bits as control signal ZCD along path 68-3B. Each of the serializer lanes (e.g., collectively implementing at least a portion of serializer block 58 in FIG. 4) may perform the serialization process based on bit clock BITCLK. In this example, the frequency of bit clock BITCLK may be at least seven times higher than the frequency of word data clock WDCLK.

Each of the control signals ZAU, ZAD, ZBU, ZBD, ZCU, and ZCD may be directly used to control corresponding driver circuits 60-1, 60-2, and 60-3 (e.g., collectively implementing at least a portion of driver circuitry 60 in FIG. 4). As shown in FIG. 5, driver circuit 60-1 includes pull-up transistor 61-1 and pull-down transistor 61-2. Transistors 61-1 and 61-2 are coupled in series between a voltage source supplying a supply voltage (e.g., voltage Vaa) and a voltage source supplying a ground voltage. Transistor 61-1 receives control signal ZAU from serializer lane 58-1, while transistor 61-2 receives control signal ZAD from serializer lane 58-2. A first output of the transmitter circuitry conveying signal ZA is coupled to the shared terminal between transistors 61-1 and 61-2.

Similarly, driver circuit 60-2 includes pull-up transistor 61-3 and pull-down transistor 61-4. Transistors 61-3 and 61-4 are coupled in series between a voltage source supplying a supply voltage (e.g., voltage Vaa) and a voltage source supplying a ground voltage. Transistor 61-3 receives control signal ZBU from serializer lane 58-3, while transistor 61-4 receives control signal ZBD from serializer lane 58-4. A second output of the transmitter circuitry conveying signal ZB is coupled to the shared terminal between transistors 61-3 and 61-4. Driver circuit 60-3 includes pull-up transistor 61-5 and pull-down transistor 61-6. Transistors 61-5 and 61-6 are coupled in series between a voltage source supplying a supply voltage (e.g., voltage Vaa) and a voltage source supplying a ground voltage. Transistor 61-5 receives control signal ZCU from serializer lane 58-5, while transistor 61-6 receives control signal ZCD from serializer lane 58-6. A third output of the transmitter circuitry conveying signal ZC is coupled to the shared terminal between transistors 61-5 and 61-6.

Based on the pull-up and pull-down operations in the driver circuits, signals ZA, ZB, and ZC may convey symbols in a multi-level signaling scheme. As described in connection with FIG. 4, because combinational logic circuitry 54 (e.g., logic circuitry for generating control signals for driver circuits) precede the serializer lanes, combinational logic circuitry 54 can receive input signals at a slower word data clock rate and serializer lanes can serve as a latching function at the higher bit clock rate for the output signals from combinational logic circuitry.

This allows the outputs of serializer lanes to be directly received (e.g., without intervening logic circuitry as shown in FIG. 3) at the control terminals of respective transistors in the driver circuits without path delay mismatch and without lane crossing. Configured in this manner, driver circuits 60-1, 60-2, and 60-3 may perform pull-up and pull-down operations with minimal timing offset relative to each other, thereby minimizing (reducing) timing offsets between signals ZA, ZB, and ZC, which lead to improved data EYE margin for the data transmitted using signals ZA, ZB, and ZC.

In comparison with the transmitter circuitry configuration of FIG. 3, the transmitter circuitry configuration in FIGS. 4 and 5 may include additional serializer circuitry (lanes) and additional signal paths.

While, in the example described in connection with FIG. 5, each set of parallel paths includes seven paths (e.g., paths 62-1 includes seven parallel paths, paths 64-1 includes seven parallel paths, paths 66-1A includes seven parallel paths, paths 62-2 includes seven parallel paths, etc.), there are three latch circuits in parallel, there are three driver circuits in parallel, and there are six serializer lanes in parallel, this example is merely illustrative. If desired, any of these number of parallel paths, parallel circuits, parallel serializer lanes may be adapted based on the signaling scheme (e.g., PAM 2-level, PAM 4-level, PAM 8-level, MIPI C-PHY, MIPI D-PHY, MIPI C/D-PHY, etc.) being employed and based on any desired needs of the transmitter circuitry and/or system. As such, the transmitter circuitry configuration in FIGS. 4 and 5 may be modified as suitable to account for these differences in signaling schemes, transmitter circuitry design, and/or system design while still providing data transmission with improved EYE margin for the transmitter data.

If desired, the illustrative configuration of transmitter circuitry shown in FIG. 5 may be one lane of the transmitter circuitry, similarly configuration may be used to form additional lanes in the transmitter circuitry.

As described in connection with FIGS. 1 and 2, the transmitter circuitry described in connection with FIGS. 4 and 5 may be implemented in any suitable system. An illustrative configuration in which the transceiver circuitry of FIGS. 4 and/or 5 (or any other suitable transceiver circuitry employing one or more embodiments described herein) is implemented in an imaging system is shown in FIG. 6 as an example.

Figure 6:
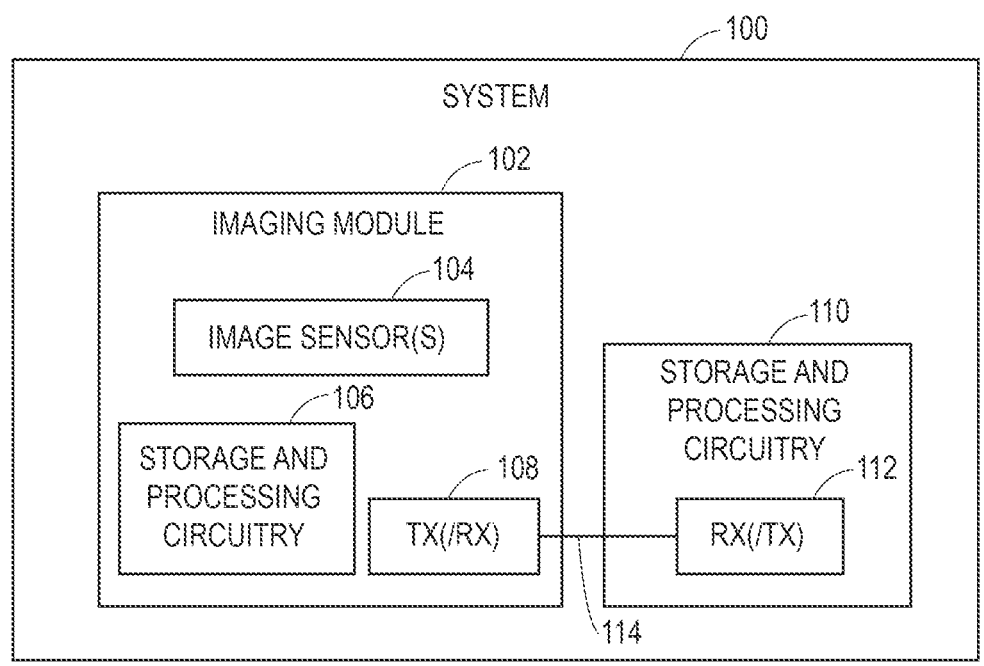
FIG. 6 is a functional block diagram of an illustrative imaging module having transmitter circuitry of the type shown in FIGS. 4 and 5 in accordance with some embodiments.

In the example of FIG. 6, system 100 (e.g., system 10 in FIG. 1) includes an imaging sub-system such as imaging module 102 (sometimes referred to herein as imaging system 102). Imaging module 102 may be used to convert incoming light into digital image data. Imaging module 102 may include one or more corresponding image sensors 104 and corresponding one or more lenses over image sensors 104. The lenses may include fixed and/or adjustable lenses and may include microlenses formed on an imaging surface of image sensor 104 and other macro lenses. If desired, camera module 102 may be provided with an array of lenses and an array of corresponding image sensors 104.

During image capture operations, light from a scene may be focused onto image sensor 104 by the lenses. Image sensor 104 may include circuitry for converting analog pixel image signals into corresponding digital image data to be provided to storage and processing circuitry 106 (e.g., similar in function to storage and processing circuitry 16 in FIG. 1) in the imaging system. If desired, storage and processing circuitry 106 may also be used to control the operation of image sensor 104 (e.g., provide timing, control signals, supply and/or bias voltages, etc. to image sensor 104).

Imaging module 102 may also include a transmitter such as transmitter 108 implementing one or more aspects of the transmitter circuitry described in connection with FIGS. 4 and 5. If desired, transmitter 108 may form a part of integrated transceiver circuitry. Transmitter 108 may convey the digital image data (or if desired, raw analog image signals) to a corresponding receiver such as receiver 112 using a multi-level signaling scheme based on the description in connection with FIGS. 4 and 5. Communications link 114 may provide any suitable number of communications channels or lanes between transmitter circuitry 108 and receiver circuitry 112.

Storage and processing circuitry 110 (e.g., storage and processing circuitry 16 in FIG. 0.10) in system 100 may also be formed as part of integrated transceiver circuitry. If desired, the transmitter portion of the integrated transceiver circuitry of storage and processing circuitry 110 may also implement one or more aspects of the transmitter circuitry described in connection with FIGS. 4 and 5. In some illustrative configurations, one or more of image sensor 104, storage and processing circuitry 106, and transmitter (transceiver) circuitry 108 may be formed in an integrated circuit die or may be integrated into the same package.

Various embodiments have been described to illustrative transmitter circuitry with improved EYE margin for transmitter data.

As an example, transmitter circuitry may include word data latch circuitry configured to receive data for transmission. The transmitter circuitry may include driver circuitry configured to provide an output for the transmitter circuitry based on the received data using a multi-level signaling scheme. The transmitter circuitry may include serializer circuitry coupled to the driver circuitry. The transmitter circuitry may include pre-driver logic circuitry (e.g., combinational logic circuitry) coupled between the latch circuitry and the serializer circuitry and configured to provide control signals to the driver circuitry. The serializer circuitry may be coupled between the pre-driver logic circuitry and the driver circuitry. The latch circuitry may be operable with a first clock signal having a first frequency, and the serializer circuitry may be operable with a second clock signal having a second frequency that is higher than the first frequency.

If desired, the combinational logic circuitry may be configured to receive the data through the latch circuitry, generate control signals for the driver circuitry based on the data, receive the data across a set of parallel input paths, and output the generated control signals along a set of parallel output paths to the serializer circuitry. The serializer circuitry may be configured to serialize the control signals on the set of parallel output paths to output a serialized output control signal. The driver circuitry may be configured to receive the serialized output control signal and to provide the output for the transmitter circuitry based on the serialized output control signal.

If desired, the latch circuitry may include a plurality of latch circuits coupled in parallel to the pre-driver logic circuitry and each coupled to the pre-driver logic circuitry via a corresponding plurality of paths. The serializer circuitry may include a plurality of serializer lanes each coupled to the pre-driver logic circuitry via an additional corresponding plurality of paths. The driver circuitry may include a plurality of transistors each coupled to a corresponding lane in the plurality of serializer lanes.

If desired, the transmitter circuitry may be included in an imaging system having an image sensor configured to generate image data based on incident light. The transmitter circuitry may be configured to perform a data transmission operation based on the image data. In particular, the combinational logic circuitry may be configured to receive word data based on the image data through the latch circuitry and to generate a control signal based on the word data, the driver circuitry may be configured to receive the control signal and to perform data transmission signaling for the data transmission operation based on the control signal. As similarly described above, the combinational logic circuitry may be disposed in a first clock domain having a first operating frequency, and the serializer circuitry and the driver circuitry may be disposed in a second clock domain having a second operating frequency that is higher than the first operating frequency. If desired, the image sensor and the transmitter circuitry may be formed on the same integrated circuit die.

If desired, the transmitter circuitry may be included in any suitable system. The serializer circuitry and the driver circuitry may be configured to operate in a first frequency domain associated with a first operating frequency, and the pre-driver logic circuitry may be configured to operate in a second frequency domain associated with a second operating frequency that is less than the first operating frequency.

The foregoing is merely illustrative of the principles of this invention and various modifications can be made by those skilled in the art without departing from the scope and spirit of the invention. The foregoing embodiments may be implemented individually or in any combination.

What is claimed is:

1. Transmitter circuitry comprising:
   latch circuitry configured to receive data for transmission and configured to receive a first clock signal;
   driver circuitry configured to provide an output for the transmitter circuitry based on the received data;
   serializer circuitry coupled to the driver circuitry and configured to receive a second clock signal; and
   pre-driver logic circuitry coupled between the latch circuitry and the serializer circuitry and configured to operate in a frequency domain associated with a frequency of the first clock signal.

2. The transmitter circuitry defined in claim 1, wherein the serializer circuitry is coupled between the pre-driver logic circuitry and the driver circuitry.

3. The transmitter circuitry defined in claim 1, wherein the pre-driver logic circuitry comprises combinational logic circuitry.

4. The transmitter circuitry defined in claim 3, wherein the combinational logic circuitry is configured to receive the data through the latch circuitry and generate control signals for the driver circuitry based on the data.

5. The transmitter circuitry defined in claim 4, wherein the combinational logic circuitry is configured to receive the data across a set of parallel input paths.

6. The transmitter circuitry defined in claim 5, wherein the combinational logic circuitry is configured to output the generated control signals along a set of parallel output paths to the serializer circuitry.

7. The transmitter circuitry defined in claim 6, wherein the serializer circuitry is configured to serialize the control signals on the set of parallel output paths to output a serialized output control signal.

8. The transmitter circuitry defined in claim 7, wherein the driver circuitry is configured to receive the serialized output control signal and to provide the output for the transmitter circuitry based on the serialized output control signal.

9. The transmitter circuitry defined in claim 1, wherein the latch circuitry comprises a plurality of latch circuits coupled in parallel to the pre-driver logic circuitry.

10. The transmitter circuitry defined in claim 9, wherein each latch circuit in the plurality of latch circuits is coupled to the pre-driver logic circuitry via a corresponding plurality of paths.

11. The transmitter circuitry defined in claim 10, wherein the serializer circuitry comprises a plurality of serializer lanes each coupled to the pre-driver logic circuitry via an additional corresponding plurality of paths.

12. The transmitter circuitry defined in claim 11, wherein the driver circuitry comprises a plurality of transistors each coupled to a corresponding lane in the plurality of serializer lanes.

13. The transmitter circuitry defined in claim 1, wherein the first clock signal is a word data clock signal, and the second clock signal is a bit clock signal.

14. The transmitter circuitry defined in claim 1, wherein the second clock signal has a frequency that is greater than the frequency of the first clock signal.

15. The transmitter circuitry defined in claim 1, wherein the driver circuitry is configured to provide the output for the transmitter circuitry based on a multi-level signaling scheme.

16. An imaging system comprising:
    an image sensor configured to generate image data based on incident light; and
    transmitter circuitry configured to perform a data transmission operation based on the image data, the transmitter circuitry comprising:
      combinational logic circuitry configured to receive word data based on the image data and to generate a control signal based on the word data;
      driver circuitry configured to receive the control signal and to perform data transmission signaling for the data transmission operation based on the control signal; and
      serializer circuitry coupled between the combinational logic circuitry and the driver circuitry and configured to operate in a first frequency domain associated with a frequency of a bit clock signal; and
    wherein the combinational logic circuitry is configured to operate in a second frequency domain associated with a frequency of a word data clock signal.

17. The imaging system defined in claim 16, wherein the transmitter circuitry comprises latch circuitry configured to provide the word data to the combinational logic circuitry.

18. The imaging system defined in claim 16, wherein the transmitter circuitry comprises latch circuitry coupled to the combinational logic circuitry, and the latch circuitry is configured to operate in the second frequency domain.

19. The imaging system defined in claim 16, wherein the image sensor and the transmitter circuitry are formed on an integrated circuit die.

20. A system comprising:
    transmitter circuitry configured to transmit data, the transmitter circuitry having:
      driver circuitry configured to provide an output for the transmitter circuitry to transmit the data;
      serializer circuitry coupled the driver circuitry, the serializer circuitry and the driver circuitry being configured to operate in a first frequency domain associated with a first operating frequency; and
      pre-driver logic circuitry coupled to the serializer circuitry and configured to provide control signals to the driver circuitry, the pre-driver logic circuitry being configured to operate in a second frequency domain associated with a second operating frequency that is less than the first operating frequency.

\* \* \* \* \*